United States Patent
Granstam

(10) Patent No.: US 10,666,302 B2
(45) Date of Patent: May 26, 2020

(54) ANTENNA FEED IN A WIRELESS COMMUNICATION NETWORK NODE

(71) Applicant: Telefonaktiebolaget LM Ericsson (publ), Stockholm (SE)

(72) Inventor: Bo Granstam, Kållered (SE)

(73) Assignee: TELEFONAKTIEBOLAGET LM ERICSSON (PUBL), Stockholm (SE)

( * ) Notice: Subject to any disclaimer, the term of this patent is extended or adjusted under 35 U.S.C. 154(b) by 0 days.

(21) Appl. No.: 16/312,127

(22) PCT Filed: Jun. 21, 2016

(86) PCT No.: PCT/EP2016/064308
§ 371 (c)(1),
(2) Date: Dec. 20, 2018

(87) PCT Pub. No.: WO2017/220131
PCT Pub. Date: Dec. 28, 2017

(65) Prior Publication Data
US 2019/0238165 A1    Aug. 1, 2019

(51) Int. Cl.
*H04M 1/00* (2006.01)
*H04B 1/04* (2006.01)
(Continued)

(52) U.S. Cl.
CPC ............ *H04B 1/0458* (2013.01); *H03F 3/24* (2013.01); *H04B 1/0483* (2013.01); *H04B 1/18* (2013.01);
(Continued)

(58) Field of Classification Search
CPC ...... H04B 1/0458; H04B 1/0483; H04B 1/18; H04B 1/44; H04B 1/40; H04W 88/08
(Continued)

(56) References Cited

U.S. PATENT DOCUMENTS 5,614,863 A * 3/1997 Pierro ............... H03F 3/245
                                                        330/1 R
5,628,057 A * 5/1997 Phillips ............ H01P 5/10
                                                        333/127
(Continued)

FOREIGN PATENT DOCUMENTS

CN   103 036 834 A   4/2013

OTHER PUBLICATIONS

International Search Report and Written Opinion issued in International Application No. PCT/EP2016/064308, dated Mar. 13, 2017, 10 pages.

*Primary Examiner* — April G Gonzales
(74) *Attorney, Agent, or Firm* — Rothwell, Figg, Ernst & Manbeck, P.C.

(57) ABSTRACT

The present disclosure relates to a wireless communication network node (1) comprising an antenna arrangement (2), a transmitter arrangement (3) that is arranged to transmit output signals, and a receiver arrangement (4) that is arranged to receive input signals. The antenna arrangement (2) comprises at least one balanced antenna element (5) and a balanced antenna connection (6) that in turn comprises a first antenna branch (7) and a second antenna branch (8). The node (1) further comprises a power divider (9) that is arranged to divide the output signal in a first branch (10) and a second branch (11). The first branch (10) is connected to the first antenna branch (7) via a first amplifier arrangement (12) and a first power distribution device (13). The second branch (11) is connected to the second antenna branch (8) via a phase inverting device (14), a second amplifier arrangement (15) and a second power distribution device (16). In this way, a balanced feed is obtained for the transmitter arrangement (3) at the balanced antenna connection (6).

11 Claims, 2 Drawing Sheets

(51) Int. Cl.
 *H04B 1/18* (2006.01)
 *H04W 88/08* (2009.01)
 *H03F 3/24* (2006.01)
 *H04B 1/40* (2015.01)
 *H04B 1/44* (2006.01)

(52) U.S. Cl.
 CPC ............... *H04B 1/40* (2013.01); *H04B 1/44* (2013.01); *H04W 88/08* (2013.01)

(58) Field of Classification Search
 USPC ................................................ 455/73, 575.7
 See application file for complete search history.

(56) References Cited

U.S. PATENT DOCUMENTS

| | | | | |
|---|---|---|---|---|
| 6,300,906 B1* | 10/2001 | Rawnick | .................. | H01Q 1/38 343/700 MS |
| 6,452,560 B2* | 9/2002 | Kunysz | .................. | G03F 7/091 343/769 |
| 6,577,199 B2* | 6/2003 | Dent | ................. | H01P 1/212 330/302 |
| 6,721,544 B1* | 4/2004 | Franca-Neto | ............. | H04B 1/52 333/172 |
| 6,904,296 B2* | 6/2005 | Geeraert | ................ | H01Q 1/243 343/700 MS |
| 7,088,185 B2* | 8/2006 | Rofougaran | ........ | H03F 3/45071 330/301 |
| 7,466,998 B2* | 12/2008 | O | .............. | H01Q 1/38 455/570 |
| 7,761,115 B2* | 7/2010 | Castaneda | ............ | H01Q 1/2266 343/702 |
| 7,864,120 B2* | 1/2011 | Dou | .................... | H01Q 1/2266 343/702 |
| 8,738,103 B2* | 5/2014 | Puente Baliarda | .... | H01Q 1/243 455/575.7 |
| 9,208,943 B2* | 12/2015 | Anderson | ............ | H03F 1/0227 |
| 9,667,206 B2* | 5/2017 | Anderson | ............... | H03F 3/213 |
| 9,831,833 B1* | 11/2017 | Xie | ........................ | H03F 1/0205 |
| 10,230,423 B2* | 3/2019 | Le-Ngoc | .................. | H04B 1/56 |
| 2003/0189519 A1* | 10/2003 | Rutfors | .................. | H01Q 1/243 343/702 |
| 2004/0009752 A1* | 1/2004 | Mohan | ................... | H04B 1/302 455/78 |
| 2006/0019611 A1* | 1/2006 | Mages | ..................... | H04B 1/52 455/73 |
| 2006/0094357 A1* | 5/2006 | McCorkle | ................ | H01P 1/203 455/41.2 |
| 2006/0267844 A1* | 11/2006 | Yanagi | .................... | H01P 1/203 343/700 MS |
| 2007/0085108 A1* | 4/2007 | White | ................... | H01L 23/552 257/173 |
| 2007/0132657 A1* | 6/2007 | Walton | .................... | H01Q 9/40 343/895 |
| 2007/0254587 A1* | 11/2007 | Schadler | ................ | H01Q 1/246 455/13.3 |
| 2008/0169993 A1* | 7/2008 | Matsuzawa | .......... | H01Q 1/1242 343/814 |
| 2009/0009399 A1* | 1/2009 | Gaucher | ............ | H01O 21/0006 343/700 MS |
| 2009/0274072 A1* | 11/2009 | Knox | ................... | H01Q 1/2225 370/278 |
| 2010/0080203 A1* | 4/2010 | Reynolds | ............. | H04B 7/2606 370/338 |
| 2010/0182096 A1* | 7/2010 | Kim | ........................ | H01P 5/10 333/26 |
| 2011/0065400 A1* | 3/2011 | Teikari | ................... | G01S 3/20 455/129 |
| 2012/0274419 A1* | 11/2012 | Lee | ........................ | H01P 1/182 333/157 |
| 2013/0285198 A1* | 10/2013 | Kihara | ................... | H01L 28/10 257/531 |
| 2014/0002182 A1* | 1/2014 | Xu | ......................... | H03F 3/195 327/563 |
| 2014/0062812 A1* | 3/2014 | Smith | ..................... | H01Q 1/38 343/730 |

* cited by examiner

ANTENNA FEED IN A WIRELESS COMMUNICATION NETWORK NODE

CROSS REFERENCE TO RELATED APPLICATION(S)

This application is a 35 U.S.C. § 371 National Stage of International Patent Application No. PCT/EP2016/064308, filed Jun. 21, 2016, designating the United States.

TECHNICAL FIELD

The present disclosure relates to a wireless communication network node comprising an antenna arrangement, a transmitter arrangement, and a receiver arrangement. The antenna arrangement comprises at least one balanced antenna element and a balanced antenna connection that in turn comprises a first antenna branch and a second antenna branch.

The present disclosure also relates to a radio device comprising a transmitter arrangement and a receiver arrangement.

BACKGROUND

In a wireless communication network, there are wireless communication devices in the form of communication nodes, for example base stations, antenna arrangements are connected to one or more transmitter device and one or more receiver devices.

A transmitter device comprising a transmitter power amplifier (PA) arrangement is normally connected to an antenna arrangement using coaxial cables. The shield of the cable is grounded and the inner conductor is surrounded by a tubular insulating layer, surrounded by a tubular conducting shield. It can be installed next to metal objects such as gutters without the power losses that occur in other types of transmission lines. Coaxial cable also provides protection of the signal from external electromagnetic interference. The antenna arrangement comprises an unbalanced RF (Radio Frequency) connection where an unbalanced coaxial cable is connected to a balanced antenna arrangement, for example a dipole antenna arrangement, where the antenna arrangement further comprises a balun. The balun is used to link the antenna element's symmetrical, balanced, circuit to the coaxial cable's asymmetrical, unbalanced, circuit.

The cable length between the PA arrangement and the unbalanced RF (Radio Frequency) connection can be reduced to large extent when mounting the transmitter device with the PA arrangement in the antenna vicinity, for example just behind the antenna unit.

It is desirable to have a more uncomplicated solution for a transmitter device and its connection to an antenna arrangement.

SUMMARY

It is an object of the present disclosure to provide a more uncomplicated solution for a transmitter device and its connection to an antenna arrangement.

Said object is obtained by means of a wireless communication network node comprising an antenna arrangement, a transmitter arrangement that is arranged to transmit output signals and a receiver arrangement that is arranged to receive input signals. The antenna arrangement comprises at least one balanced antenna element and a balanced antenna connection that in turn comprises a first antenna branch and a second antenna branch. The node further comprises a power divider that is arranged to divide the output signal in a first branch and a second branch. The first branch is connected to the first antenna branch via a first amplifier arrangement and a first power distribution device. The second branch is connected to the second antenna branch via a phase inverting device, a second amplifier arrangement and a second power distribution device. In this way, a balanced feed is obtained for the transmitter arrangement at the balanced antenna connection.

Said object is also obtained by means of a radio device comprising a transmitter arrangement that is arranged to transmit output signals, and a receiver arrangement that is arranged to receive input signals. The radio device further comprises a power divider that is arranged to divide the output signal in a first branch and a second branch. The first branch is arranged to be connected to a first antenna branch of a balanced antenna connection via a first amplifier arrangement and a first power distribution device. The second branch is arranged to be connected to a second antenna branch of the balanced antenna connection via a phase inverting device, a second amplifier arrangement (and a second power distribution device. In this way, a balanced feed is enabled for the transmitter arrangement.

A number of advantages are obtained by means of the present disclosure. For example:

For some classes and/or frequency of power amplifiers, the total cost to manufacture and/or the total power consumption may be decreased by replacing one PA with two half power PA:s.

In case of cooling problems when using a single PA, the split to use two PA will be advantageous.

In case the total power should be increased an existing PA can easily be re-used, providing a fast development track.

The balun circuits of the antenna can be omitted.

2nd harmonics of the amplifiers are reduced due to the symmetrical output.

According to an example, the power distribution devices are arranged to distribute power between the antenna arrangement and each one of the transmitter arrangement and the receiver arrangement.

According to another example, the receiver is connected symmetrically to the first antenna branch and the second antenna branch via the corresponding power distribution device.

According to another example, the first amplifier arrangement, the first power distribution device, the second amplifier arrangement and the second power distribution device are all comprised in the antenna arrangement.

This results in a relatively short cable lengths, providing a more cost-effective arrangement.

More examples are disclosed in the dependent claims.

BRIEF DESCRIPTION OF THE DRAWINGS

The present disclosure will now be described more in detail with reference to the appended drawings, where.

DETAILED DESCRIPTION

Figure 1:
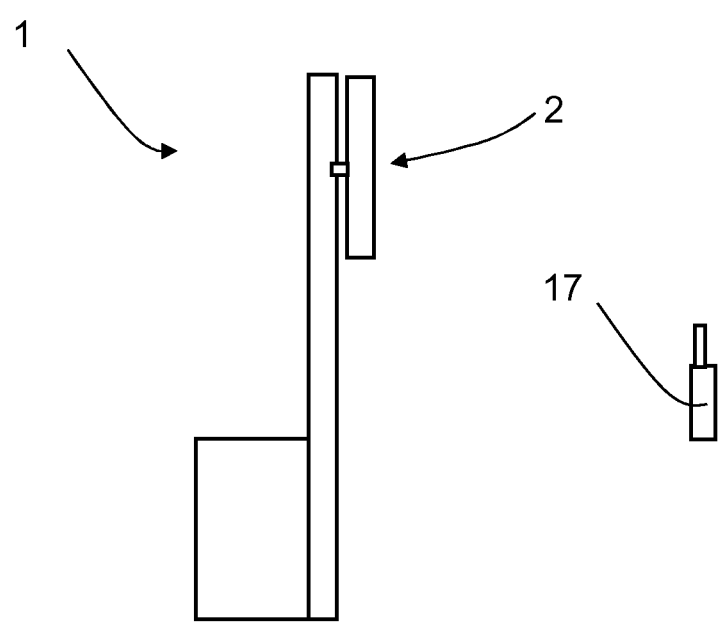
FIG. 1 shows a schematic side view of a node in a wireless communication network.

With reference to FIG. 1, there is a node 1 in a wireless communication network, constituting a wireless communication network node 1 that comprises an antenna arrangement 2.

Figure 2:
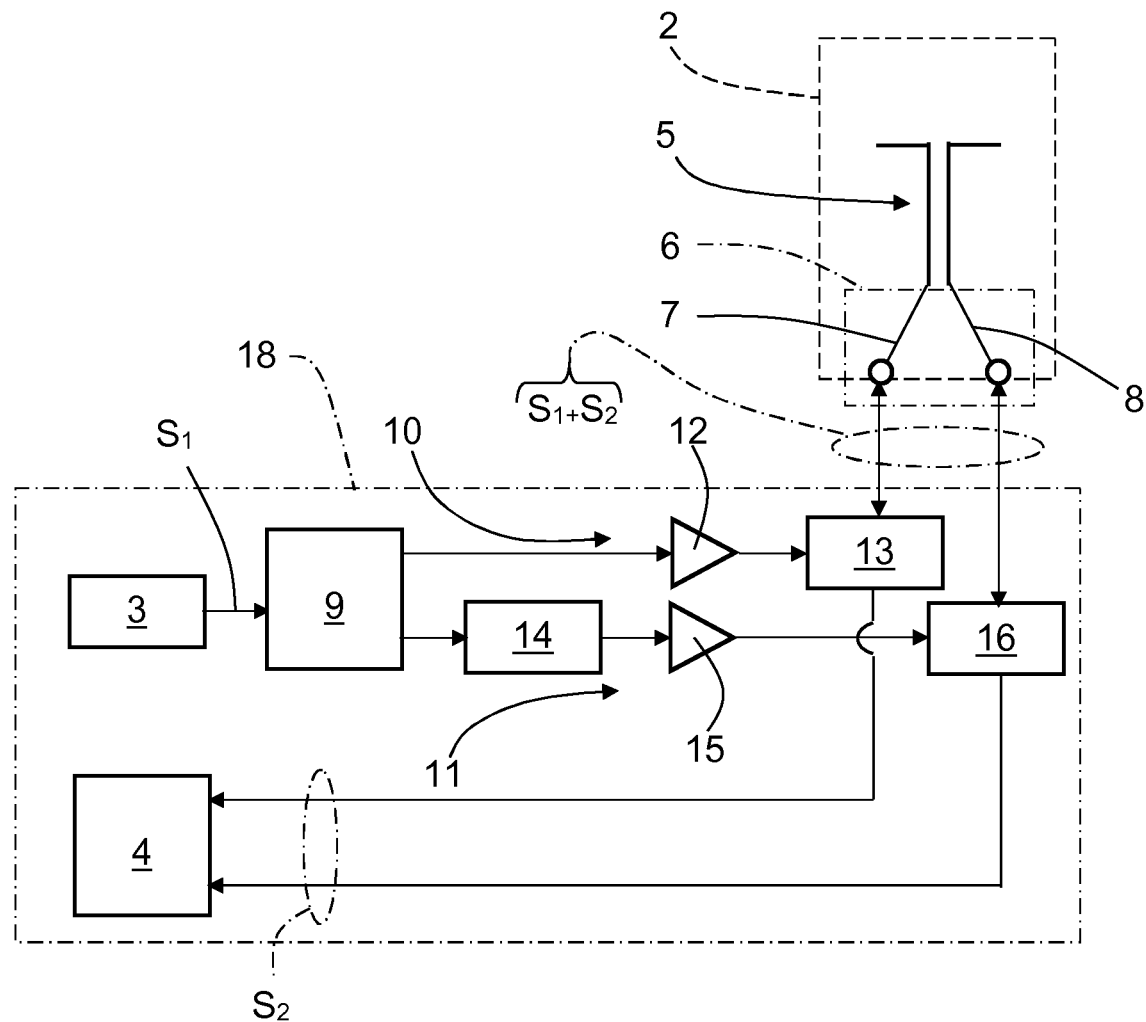
FIG. 2 shows a schematic view of an arrangement according to the present disclosure.

With reference to FIG. 2, the node 1 comprises a transmitter arrangement 3 that is arranged to transmit output signals $S_1$ and a receiver arrangement 4 that is arranged to receive input signals $S_2$. The antenna arrangement 2 comprises at least one balanced antenna element 5 and a balanced antenna connection 6 that in turn comprises a first antenna branch 7 and a second antenna branch 8. Normally, there is an array of antenna elements that are connected by means of a suitable distribution network, in FIG. 2 only one antenna element 5 is shown, but it should be regarded as representing one or more antenna elements. Here, the antenna element 5 shown is in the form of a dipole antenna, but other types of balanced antenna elements are of course conceivable.

According to the present disclosure, the node 1 further comprises a power divider 9 that is arranged to divide the output signal $S_1$ in a first branch 10 and a second branch 11. The first branch 10 is connected to the first antenna branch 7 via a first amplifier arrangement 12 and a first power distribution device 13, and the second branch 11 is connected to the second antenna branch 8 via a phase inverting device 14, a second amplifier arrangement 15 and a second power distribution device 16. By means of this arrangement, a balanced feed is obtained for the transmitter arrangement 3 at the balanced antenna connection 6 without having to use a balun. The output signal $S_1$ is then functionally symmetrical between the two antenna branches 7, 8. The amplifier arrangements 12, 15 are suitably tuned for half the input impedance of the antenna arrangement 2 and the power will be combined at the antenna element 5 or antenna elements from the two amplifier arrangements 12, 15 without loss.

This means that the transmitter arrangement 3 is arranged to transmit said output signals $S_1$ via both the first branch 10 and the second branch 11, where the power divider 9 is connected to the transmitter arrangement 3 and is arranged to divide the output signal in two parts, one part for the first branch 10 and another part for the second branch 11. These parts are according to some aspects equal, but may alternatively be unequal.

The power distribution devices 13, 16 are arranged to distribute power between the antenna arrangement 2 and each one of the transmitter arrangement 3 and the receiver arrangement 4. The power distribution devices 13, 16 are arranged to forward the output signals $S_1$ from the transmitter arrangement 3 to the antenna arrangement 2, but to suppress the output signals $S_1$ towards the receiver arrangement 4. The power distribution devices 13, 16 are also arranged to forward the input signals $S_2$ from the antenna arrangement 2 to the receiver arrangement 4, but to suppress the input signals $S_2$ towards the transmitter arrangement 3. The input signals $S_2$ have in this example been transmitted to the node 1 from a wireless device 17.

For this purpose, according to some aspects, each one of the power distribution devices 13, 16 is constituted by a circulator and/or a duplex filter such as a diplexer.

In this manner, a balun is not needed, and two amplifier arrangements can be used instead of one. Suitably, each one of the amplifier arrangements 12, 15 is arranged for about half the power of a prior art power amplifier arrangement for a case where only one power amplifier arrangement and a balun is used. This is advantageous in the case where one high power amplifier arrangement is more expensive to manufacture and/or has a higher power consumption than two power amplifiers arrangements of half the power. This also enables the use of another class of amplifier arrangements.

Furthermore, possible cooling problems using only one power amplifier arrangement may be reduced by means of the present disclosure when one power amplifier arrangement is replaced by two amplifiers arrangements 12, 15 of half the power.

Alternatively, in case the total power should be increased in a new design, an existing power amplifier arrangement can be re-used and duplicated, providing a fast development track using a previously known power amplifier arrangement.

Furthermore, $2^{nd}$ harmonics of the power amplifiers arrangements 12, 15 may be reduced due to the symmetrical output.

According to some aspects, in order to provide a balanced connections for the receiver arrangement 4, it is connected symmetrically to the first antenna branch 7 and the second antenna branch 8 via the corresponding power distribution device 13, 16.

In order to avoid losses and the use of long expensive coaxial cables, according to some aspects the first amplifier arrangement 12, the first power distribution device 13, the second amplifier arrangement 15 and the second power distribution device 16 all are comprised in the antenna arrangement 2. Other alternatives are possible; for example, the transmitter arrangement 3, the receiver arrangement 4, the phase inverting device 14 and the power divider 9 may also be comprised in the antenna arrangement 2. Alternatively, only the amplifiers arrangements 12, 15 are comprised in the antenna arrangement 2. The transmitter arrangement 3, the receiver arrangement 4, the power divider 9, the phase inverting device 14, the amplifier arrangements 12, 15 and the power distribution device 13, 16 are in this example comprised in a radio device 18. Which parts of the radio device 18, if any, that are placed in the antenna arrangement 2 may thus vary.

Having the radio device 18 placed in the antenna arrangement 2 results in short cable lengths, which makes it cost-effective to use two cables for the connections to the antenna arrangement 18, in accordance to the present disclosure.

According to some aspects, each one of the power distribution devices 13, 16 is constituted by:
a filter combiner
a diplexer
a directional coupler; or
a circulator.

The node 1 may comprise several antenna arrangements and several radio devices. Normally, several other parts which are well-known to the skilled person are also comprised in the radio device 18, such as one or more oscillators, digital-to-analog converters and/or mixers. Here, however, only these parts necessary for describing the present disclosure have been discussed.

In this context, a node is constituted by a wireless communication device such as a base station, repeater station, user terminal or similar. The wireless device 17 is constituted by a repeater station or a user terminal, such as a UE (User Equipment).

The phase inverting device 14 is arranged to create a phase shift of 180°; this should not be regarded to be mathematically exact, but within what is practically obtainable in this technical field.

Generally, the present disclosure relates to a wireless communication network node 1 comprising an antenna arrangement 2, a transmitter arrangement 3 that is arranged to transmit output signals, and a receiver arrangement 4 that is arranged to receive input signals, where the antenna arrangement 2 comprises at least one balanced antenna element 5 and a balanced antenna connection 6 that in turn comprises a first antenna branch 7 and a second antenna branch 8. The node 1 further comprises a power divider 9 that is arranged to divide the output signal in a first branch 10 and a second branch 11, where the first branch 10 is connected to the first antenna branch 7 via a first amplifier arrangement 12 and a first power distribution device 13, and where the second branch 11 is connected to the second antenna branch 8 via a phase inverting device 14, a second amplifier arrangement 15 and a second power distribution device 16 such that a balanced feed is obtained for the transmitter arrangement 3 at the balanced antenna connection 6.

According to an example, the power distribution devices 13, 16 are arranged to distribute power between the antenna arrangement 2 and each one of the transmitter arrangement 3 and the receiver arrangement 4.

According to an example, the receiver 4 is connected symmetrically to the first antenna branch 7 and the second antenna branch 8 via the corresponding power distribution device 13, 16.

According to an example, the first amplifier arrangement 12, the first power distribution device 13, the second amplifier arrangement 15 and the second power distribution device 16 all are comprised in the antenna arrangement 2.

According to an example, each one of the power distribution devices 13, 16 is constituted by:
a filter combiner
a diplexer
a directional coupler; or
a circulator.

Generally, the present disclosure also relates to a radio device 18 comprising a transmitter arrangement 3 that is arranged to transmit output signals and a receiver arrangement 4 that is arranged to receive input signals. The radio device 18 further comprises a power divider 9 that is arranged to divide the output signal in a first branch 10 and a second branch 11, where the first branch 10 is arranged to be connected to a first antenna branch 7 of a balanced antenna connection 6 via a first amplifier arrangement 12 and a first power distribution device 13, and where the second branch 11 is arranged to be connected to a second antenna branch 8 of a balanced antenna connection 6 via a phase inverting device 14, a second amplifier arrangement 15 and a second power distribution device 16 such that a balanced feed is enabled for the transmitter arrangement 3.

According to an example, the receiver 4 is arranged to be connected symmetrically to the balanced antenna connection 6 via the corresponding power distribution device 13, 16.

The invention claimed is:

1. A wireless communication network node comprising:
an antenna arrangement;
a transmitter arrangement that is arranged to transmit an output signal; and
a receiver arrangement that is arranged to receive input signals, wherein
the antenna arrangement comprises at least one balanced antenna element and a balanced antenna connection,
the balanced antenna connection comprises a first antenna branch and a second antenna branch,
the wireless communication network node further comprises a power divider that is arranged to divide the output signal into a first divided output signal in a first branch and a second divided output signal in a second branch,
the first branch is connected to the first antenna branch via a first amplifier arrangement and a first power distribution device, and
the second branch is connected to the second antenna branch via a phase inverting device, a second amplifier arrangement, and a second power distribution device such that a balanced feed is obtained for the transmitter arrangement at the balanced antenna connection.

2. The wireless communication network node of claim 1, wherein the first and second power distribution devices are arranged to distribute power between the antenna arrangement and each one of the transmitter arrangement and the receiver arrangement.

3. The wireless communication network node of claim 1, wherein the receiver arrangement is connected symmetrically to the first antenna branch and the second antenna branch via the first power distribution device and the second power distribution device.

4. The wireless communication network node of claim 1, wherein the first amplifier arrangement, the first power distribution device, the second amplifier arrangement, and the second power distribution device are comprised in the antenna arrangement.

5. The wireless communication network node of claim 1, wherein each one of the first and second power distribution devices comprises:
a filter combiner;
a diplexer;
a directional coupler; or
a circulator.

6. The wireless communication network node of claim 1, wherein the receiver arrangement is configured to receive the input signals from the balanced antenna connection via the first power distribution device and the second power distribution device.

7. The wireless communication network node of claim 1, wherein the wireless communication network node does not include a balun.

8. A radio device comprising:
a transmitter arrangement that is arranged to transmit an output signal;
a receiver arrangement that is arranged to receive input signals;
a power divider that is arranged to divide the output signal into a first divided output signal in a first branch and a second divided output signal in a second branch, wherein the first branch is arranged to be connected to a first antenna branch of a balanced antenna connection via a first amplifier arrangement and a first power distribution device, and
the second branch is arranged to be connected to a second antenna branch of a balanced antenna connection via a phase inverting device, a second amplifier arrangement and a second power distribution device such that a balanced feed is enabled for the transmitter arrangement.

9. The radio device according to claim 8, wherein the receiver arrangement is arranged to be connected symmetrically to the balanced antenna connection via the first power distribution device and the second power distribution device.

10. The radio device according to claim 8, wherein the receiver arrangement is configured to receive the input signals from the balanced antenna connection via the first power distribution device and the second power distribution device.

11. The radio device according to claim 8, wherein the radio device does not include a balun.

\* \* \* \* \*